United States Patent
Merz et al.

(10) Patent No.: US 11,039,544 B2
(45) Date of Patent: Jun. 15, 2021

(54) SYSTEMS AND METHODS FOR COUPLING SECTIONS OF AN ELECTRONIC DEVICE

(71) Applicant: Apple Inc., Cupertino, CA (US)

(72) Inventors: Nicholas Merz, San Francisco, CA (US); Daniel Jarvis, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/573,773

(22) Filed: Sep. 17, 2019

(65) Prior Publication Data

US 2020/0015378 A1  Jan. 9, 2020

Related U.S. Application Data

(63) Continuation of application No. 15/892,320, filed on Feb. 8, 2018, now Pat. No. 10,433,442, which is a
(Continued)

(51) Int. Cl.
*H05K 5/00* (2006.01)
*H05K 5/02* (2006.01)
(Continued)

(52) U.S. Cl.
CPC ......... *H05K 5/0247* (2013.01); *G06F 1/1656* (2013.01); *H05K 5/0004* (2013.01);
(Continued)

(58) Field of Classification Search
CPC ..... H01Q 1/243; G06F 1/1626; G06F 1/1656; H05K 5/0247; H05K 5/0004; H05K 5/0217; Y10T 29/49002; H04M 1/0202
See application file for complete search history.

(56) References Cited

U.S. PATENT DOCUMENTS

| 7,697,281 B2 | 4/2010 | Dabov et al. |
| 7,947,900 B2 | 5/2011 | Cheng et al. |

(Continued)

FOREIGN PATENT DOCUMENTS

| CN | 1809255 | 7/2006 |
| CN | 101500386 | 8/2009 |

(Continued)

OTHER PUBLICATIONS

International Search Report, PCT Application No. PCT/US2012/020304, 6 pages, dated Apr. 2, 2012.
(Continued)

*Primary Examiner* — Pete T Lee
(74) *Attorney, Agent, or Firm* — Brownstein Hyatt Farber Schreck, LLP

(57) ABSTRACT

This is directed to systems and methods for coupling sections of an electronic device together. Sections of an electronic device can be coupled together via "knuckles." The particular shape and structure of the knuckles can be based on various design considerations. For example, in some embodiments each section can function as an individual antenna. In this case, the knuckles can be designed in order to provide electrical isolation between the sections, thus allowing proper operation of the antennas. For example, the knuckles can be formed from a dielectric material, etc. As another design example, the knuckles can be designed in order to provide increased strength in areas of high strain, and/or to counteract torsional twisting in areas of high impact. As yet another design example, the knuckle can be designed in a manner that is aesthetically pleasing or which otherwise meets cosmetic requirements.

21 Claims, 15 Drawing Sheets

Related U.S. Application Data continuation of application No. 14/323,566, filed on Jul. 3, 2014, now Pat. No. 9,894,787, which is a continuation of application No. 12/987,741, filed on Jan. 10, 2011, now Pat. No. 8,772,650.

(51) Int. Cl.
*G06F 1/16* (2006.01)
*H04M 1/02* (2006.01)

(52) U.S. Cl.
CPC ......... *H05K 5/0217* (2013.01); *H04M 1/0202* (2013.01); *Y10T 29/49002* (2015.01)

(56) References Cited

U.S. PATENT DOCUMENTS

| | | | |
|---|---|---|---|
| 2009/0017263 A1* | 1/2009 | Yeates | C03C 27/02 428/167 |
| 2009/0280316 A1 | 11/2009 | Lee et al. | |
| 2009/0284109 A1 | 11/2009 | Lee et al. | |
| 2011/0291896 A1 | 12/2011 | Pascolini et al. | |
| 2012/0009983 A1 | 1/2012 | Mow et al. | |
| 2012/0157175 A1* | 6/2012 | Golko | H01Q 1/241 455/575.7 |

FOREIGN PATENT DOCUMENTS

| | | |
|---|---|---|
| CN | 101911854 | 12/2010 |
| WO | WO 2009/126480 | 10/2009 |

OTHER PUBLICATIONS

Author Unknown, "iPhone4," http://en.wikipedia.org/w/index.php?title=Special:Book&bookcmd=download&collection_id=8447417ccc7458e3&writer=rl&return_to=iPhone4, 15 pages, Mar. 18, 2012.

Author Unknown, "iFixit: iPhone4 teardown," http://www.ifixit.com/teardown/iphone-4-teardown/3130/1, 4 pages, Mar. 26, 2012.

* cited by examiner

SYSTEMS AND METHODS FOR COUPLING SECTIONS OF AN ELECTRONIC DEVICE

CROSS-REFERENCE TO RELATED APPLICATION(S)

This application is a continuation patent application of U.S. patent application Ser. No. 15/892,320, filed Feb. 8, 2018 and titled "Systems and Methods for Coupling Sections of an Electronic Device," which is a continuation patent application of U.S. patent application Ser. No. 14/323,566, filed Jul. 3, 2014 and titled "Systems and Methods for Coupling Sections of an Electronic Device," now U.S. Pat. No. 9,894,787, which is a continuation patent application of U.S. patent application Ser. No. 12/987,741, filed Jan. 10, 2011 and titled "Systems and Methods for Coupling Sections of an Electronic Device," now U.S. Pat. No. 8,772,650, the disclosures of which are hereby incorporated by reference herein in their entireties.

FIELD

Systems and methods are disclosed for coupling sections of an electronic device. In particular, components of an electronic device can be assembled from two or more sections, where these sections may be coupled together using knuckles.

BACKGROUND

A portable electronic device can be constructed using different approaches. In some cases, an electronic device can be constructed by assembling several components together. These "components" can include external components that are combined to form a device enclosure (e.g., a device "housing"), as well as internal components that may provide structural support or other functionality for the electronic device (e.g., the internal component could be a microchip). Based on the design of the electronic device, the components can be formed from any suitable material(s) such as metals, plastics, or any other materials.

In some cases, the various components of the electronic device can operate as part of an electrical circuit. For example, a particular component could serve as a resistor or as a capacitor to another part of the electronic device. As another example, a component can function as part of an antenna assembly of the electronic device. If the component is used in only a single electrical circuit, then the component may be constructed from a single piece of conductive material. If the same component, however, is used in several different electrical circuits, the component may need to be constructed from several "sections" of conductive elements. In this case, however, it may be necessary to separate each of the conductive sections with an insulating or other nonconductive material, in order to ensure that each section operates in its own electrical circuit correctly.

SUMMARY

This is directed to systems and methods for coupling sections of an electronic device. In some embodiments, an electronic device can be formed from several components, such as an outer periphery component and/or other components. The outer periphery component may provide a housing structure for the electronic device by encircling the electronic device. In some cases, this outer periphery component can be assembled from two or more "sections." Knuckles may then be used to couple these sections together.

The shape and structure of the knuckles can be based on various design considerations. For example, in some embodiments each section of the outer periphery component can function as an individual antenna, or as any other suitable electric circuit component. In this case, the knuckles can be designed in order to provide electrical isolation between the sections. For example, the knuckles can be formed from a dielectric material, can be designed to have minimum capacitance requirements, and the like. As another design example, the knuckles can be designed in order to provide increased strength in areas of high strain, and/or to counteract torsional twisting in areas of high impact. As yet another design example, the knuckle can be designed in a manner that is aesthetically pleasing or which otherwise meets cosmetic requirements.

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

An electronic device can include several components assembled together to form internal and/or external features of the electronic device. For example, one or more internal components (e.g., electrical circuitry and/or internal support structures) can be placed within external components (e.g., housing structures) to provide an electronic device having desired functionality. As used herein, the term "component" refers to a distinct entity of an electronic device, such as a particular electronic circuit (e.g., a microchip), a member forming the housing of the electronic device (e.g., a backplate, an outer periphery component, and the like), an internal support structure (e.g., a mid-plate), and the like.

In some cases, a component can be manufactured by assembling and connecting two or more different individual elements (i.e., "sections") together. As used herein, the term "section" refers to an individual portion of a component, where that component may be formed from multiple sections. The various sections of the component may then be coupled together using a "knuckle." Based on the desired functionality and design of the component and its sections, these knuckles can exhibit a wide range of shapes and structures. For example, the knuckles can include structural designs that reinforce the knuckle at areas of high mechanical strain, that counteract twisting movements at areas of high torsion, that interlock with the sections to provide enhanced coupling support between the sections, that provide electrical isolation between the sections, and the like.

Figure 1:
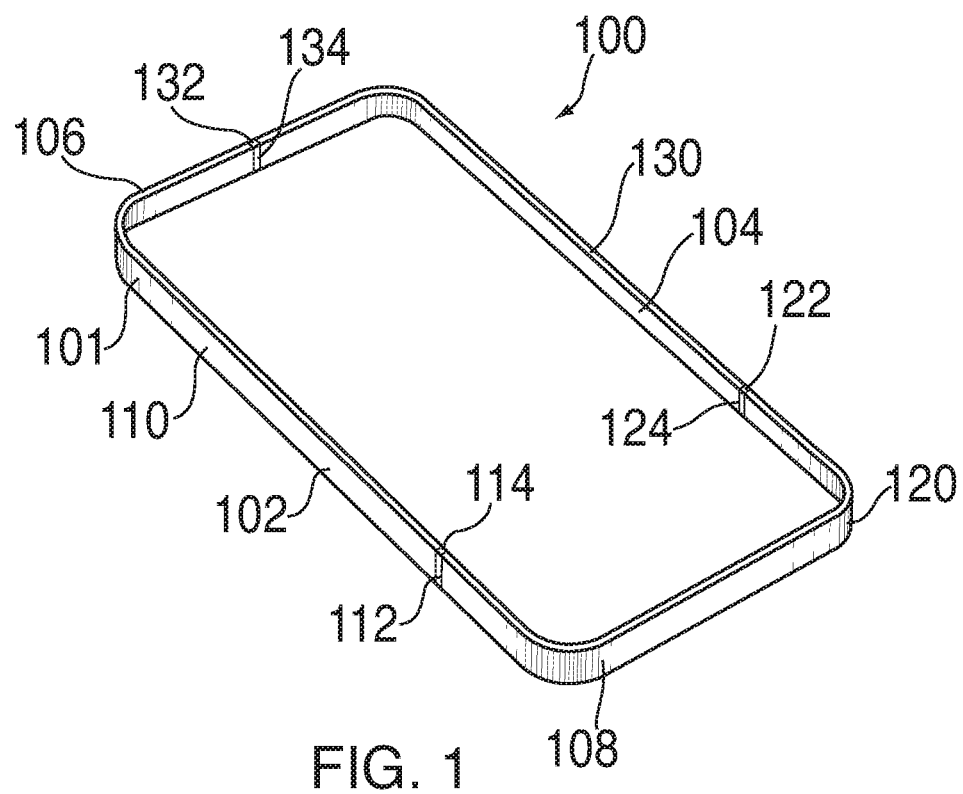
FIG. 1 is a schematic view of an illustrative outer periphery component constructed by connecting several sections together in accordance with some embodiments of the invention.

FIG. 1 shows a schematic view of an illustrative component of an electronic device in accordance with some embodiments of the present invention. In particular, FIG. 1 shows outer periphery component 100 that can be constructed by connecting several sections together, such as sections 110, 120, and 130. Outer periphery component 100 can be constructed to form an exterior, periphery surface for an electronic device. In particular, outer periphery component 100 can surround or wrap around some or all of the internal components (e.g., electronic circuits, internal support structures, and the like) of the electronic device. In other words, outer periphery component 100 can define an internal volume into which internal components can be placed. For example, outer periphery component 100 can wrap around the electronic device such that external surface 101 of outer periphery component 100 defines a left surface 102, a right surface 104, a top surface 106, and a bottom surface 108 of the electronic device.

The thickness, length, height, and cross-section of outer periphery component 100 can be selected based on any suitable criteria including, for example, based on structural requirements (e.g., stiffness or resistance to bending, compression, tension or torsion in particular orientations). In some embodiments, outer periphery component 100 can serve as a structural member to which other electronic device components can be mounted. Some of the structural integrity of outer periphery component 100 can come from the closed shape that it defines (e.g., outer periphery component 100 forms a loop, thus providing structural integrity).

Outer periphery component 100 can have any suitably shaped cross-section. For example, outer periphery component 100 can have a substantially rectangular cross-section. Each corner of the substantially rectangular cross-section can be rounded in shape, thus forming a "spline." As used herein, the term "spline" refers to a rounded corner portion of an outer periphery component. In some embodiments, outer periphery component 100 can have a cross-section in any other suitable shape including, for example, a circular shape, an oval shape, a polygonal shape, or a curved shape. In some embodiments, the shape or size of the cross-section of outer periphery component 100 can vary along the length or width of the electronic device (e.g., an hourglass shaped cross-section).

Outer periphery component 100 of the electronic device can be constructed using any suitable process. In some embodiments, outer periphery component 100 can be constructed by connecting section 110 and section 120 together at interface 112, connecting section 120 and section 130 together at interfaces 122, and connecting section 130 and section 110 together at interface 132. Although outer periphery component 100 is illustrated in FIG. 1 as being constructed from three sections, one skilled in the art could appreciate the outer periphery component 100 could alternatively be formed from any suitable number of two or more sections, and that the interfaces between the sections may be positioned at any location on outer periphery component 100. Based on where the interfaces are located, the sections of outer periphery component 100 can have any suitable shape. For example, in FIG. 1 the sections are illustrated as having a large L-shaped section 110, small L-shaped section 130, and U-shaped section 120.

Each section can be constructed individually and later assembled to form outer periphery component 100. For example, each section can be individually constructed using one or more of stamping, machining, working, casting, or any combinations of these. In some embodiments, the materials selected for sections 110, 120 and 130 can be conductive, thus allowing the sections to provide an electrical functionality for the electronic device. For example, sections 110, 120, and/or 130 can be formed from a conductive material and may then serve as an antenna for the electronic device.

To join the individual sections together, intermediate knuckles 114, 124 and 134 can be placed within interfaces 112, 122, and 132, respectively. In some embodiments, each of the knuckles can be constructed from a material that can begin in a first state and may subsequently change to a second state. As an illustration, the knuckles can be constructed from a plastic that begins in a first, liquid state and then subsequently changes to a second, solid state. While in the liquid state, the plastic can be allowed to flow into interfaces 112, 122, and 132. After flowing into these interfaces, the plastic material may subsequently be allowed to harden into knuckles 114, 124 and 134 (e.g., the plastic material is allowed to change into the second, solid state). Upon changing into the solid state, the plastic material may then bond together sections 110 and 120, 120 and 130, and 130 and 110, respectively, thus forming a single new component (e.g., outer periphery component 100).

In addition to a material that is allowed to change from a first to a second state, any other suitable material or process can be used to form knuckles 114, 124 and 134. For example, the knuckles can include a mechanical fastener, connector, clip, or other connector piece that is prefabricated and then inserted between the component's sections. As another example, in some cases, the knuckles can include an adhesive that is used instead of or in addition to a mechanical fastener or connector. For example, an adhesive layer can be placed between the sections being connected. The adhesive layer can be provided using any suitable approach including, for example, as a liquid or paste adhesive, tape, heat-based adhesive, or combination of these. In some embodiments, an adhesive layer can have a reduced thickness or width (e.g., reducing the space between the sections) to ensure that the sections are properly connected. This may be due to mechanical properties of the adhesive, as a thicker layer of the adhesive may have limited strength in bending, compression, peeling, or tension.

Figure 2:
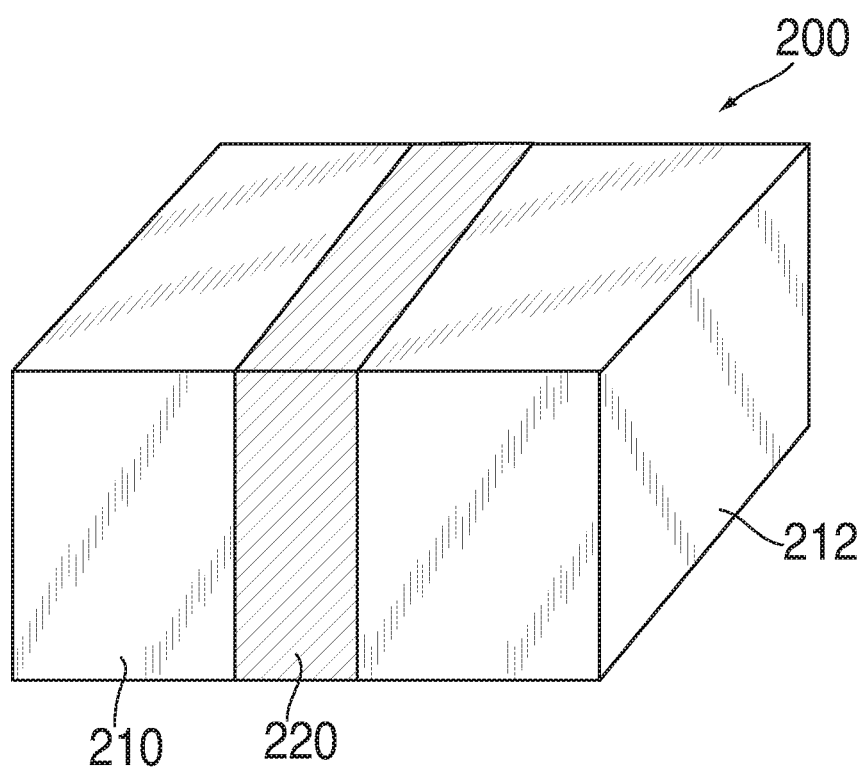
FIG. 2 is a schematic view of a portion of an illustrative electronic device component in accordance with some embodiments of the invention.

FIG. 2 is a schematic close-up view of an interface between two sections of a component. For example, FIG. 2 shows a partial view of component 200 that can be constructed from first section 210 and second section 212, which may then be coupled together by knuckle 220.

First and second sections 210 and 212 may each be constructed from the same material, or may each be constructed from a different material. For example, first and second sections 210 and 212 can be constructed from one or more of a metal material, a plastic material, a composite material, an organic material, or any combinations of these. In some cases, one or both of sections 210 and 212 can be constructed from conductive materials (and thus be used as part of the circuitry within the electronic device, such as an antenna), but may need to be electrically isolated from one another for proper functioning of device circuitry. In such cases, knuckle 220 can be constructed from an insulating or dielectric material to prevent an electrical signal from crossing the gap between first section 210 and second section 212. In some embodiments, knuckle 220 can be constructed from a combination of conductive and insulating materials, where the insulating materials are disposed between the conductive materials. Alternatively, one or more conductive materials can be embedded within insulating materials.

Any suitable knuckle material and process can be used to connect knuckle 220 between first section 210 and second section 212. For example, as described above with regards to knuckles 114, 124, and 134 of FIG. 1, a knuckle material which changes from a first state to a second state can be used. Such a knuckle material could include a liquid or a moldable solid (e.g., a soft clay-like state) that can be placed between sections 210 and 212 such that the knuckle material is shaped into a suitable knuckle. Once properly positioned between the first section 210 and second section 212 (e.g., filling the gap between the sections), the knuckle material can change to a second state in which the knuckle material adheres to the sections and provides a structurally sound bond (e.g., a mechanical bond) between first section 210 and second section 212.

During manufacturing of first section 210 and second section 212, variations or errors in the sections' shapes can occur due to manufacturing tolerances etc. However, because the knuckle material can flow into any gap between the first section 210 and second section 212 while in the first state, the knuckle material can absorb or erase these variations. This can beneficially result in component 200 being constructed with a higher precision than its individual sections 210 and 212. In this manner, this approach can be forgiving of imperfections and other manufacturing artifacts along the exposed surface of first section 210 and second section 212. In fact, the opposing surfaces of first section 210 and second section 212 may not need to have corresponding features, as the opposing surfaces of the first and second sections may not engage or need to be placed in close proximity (e.g., as would otherwise be required with an adhesive). Moreover, the knuckle material can readily flow around and into features of first section 210 and second section 212 (as described below), thus ensuring that the knuckle material is securely locked into the first and second sections upon hardening.

Any suitable process can be used to place the knuckle material between first section 210 and second section 212, and any suitable process can be used to change the knuckle material from the first state to the second state. In some embodiments, a "molding process" can be used in which the knuckle material is initially inserted in a liquid state and then is subsequently hardened. For example, one or more of injection molding, compression molding, transfer molding, extrusion molding, blow molding, thermoforming, vacuum forming, or rotomolding processes can be used. In this case, a "one shot" process can be used in which the knuckle material is inserted in a single step, and then independently changes to its second state. In other words, the knuckle can be formed in a single step (e.g., in "one shot") without necessitating additional steps or manufacturing processes.

As another example, a brazing process can be used instead of or in addition to a molding process. For example, a dielectric composite material can be brazed between first section 210 and second section 212. In one implementation, a composite material can be placed in a fixture between first section 210 and second section 212, and the composite material can be heated so that it melts and fills a region between the sections. For example, first section 210, second section 212 and the composite material can be placed in contact with a heated surface, thus causing the composite material to heat and flow. The composite material can be cooled once it has filled the region between first section 210 and second section 212, thus forming a secure bond between the composite material and the sections. Any suitable type of brazing can be used including, for example, torch blazing, furnace brazing, braze welding, vacuum brazing, or dip brazing. Any suitable composite material can be used, such as, for example, plastic, rubber, organic composites, non-conductive metal alloys, any other suitable dielectric or insulating, materials, or any combinations of these. Furthermore, the geometry of features along internal surfaces of first section 210 and second section 212 can be selected and designed to enhance the brazed bond.

Figure 3A:
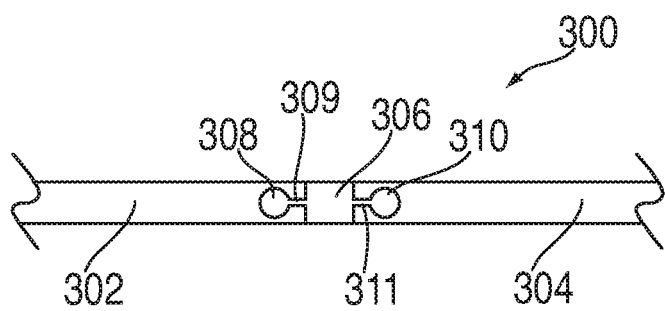
FIGS. 3A-3C are schematic top views of illustrative components that include a knuckle in accordance with some embodiments of the invention.
Figure 3B:
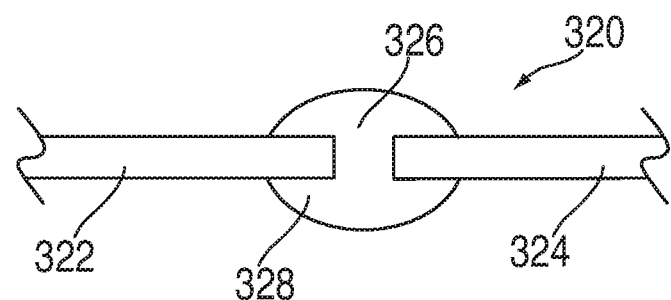
Figure 3C:
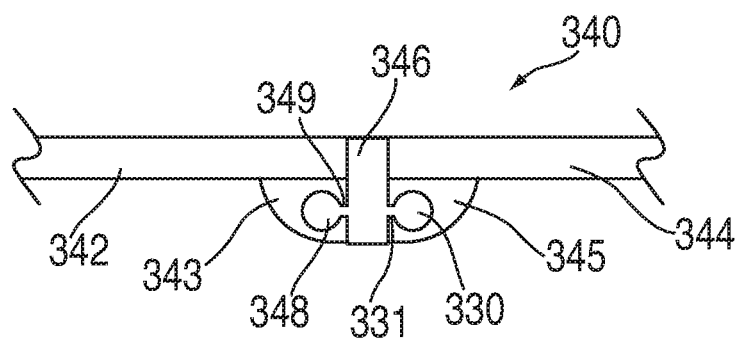

The sections connected by the knuckle can include any suitable feature for improving the adhesion between the sections and the knuckle. FIGS. 3A-3C show schematic top views of illustrative components including first and second sections coupled by a knuckle in accordance with some embodiment of the invention. The first and second sections can include any suitable feature for improving a bond with the knuckle. In some embodiments, the sections can include one or more internal features that provide an interlocking interface, or that increase the surface area required for adhering the knuckle to the first and second sections. For example, a section can include a curved internal feature (e.g., a spherical or cylindrical recess or protrusion) into or around which material from the knuckle can extend, thus increasing a surface tension-based force. As another example, a section can include a feature having one or more openings, holes, hooks or other attributes that can engage a corresponding feature of the knuckle, once the knuckle has transitioned to the second state (e.g., a hole in the first section into which a post of the knuckle can extend). In some embodiments, the sections can include locking features such as a recessed edge that forms a hook into which the knuckle material can flow.

Component 300 shown in FIG. 3A can be constructed by connecting first section 302 and second section 304 using knuckle 306. To improve the adhesion between first section 302 and knuckle 306, first section 302 can include opening 308 within the body of first section 302. Similarly, second section 304 can include opening 310 within the body of second section 304. Openings 308 and 310 can be connected to the main body of knuckle 306 via channels 309 and 311, respectively. These openings and channels can have any suitable size or shape including, for example, a shape selected such that the channel is smaller than the opening. This can ensure that the knuckle material which flows into the opening cannot pass back through the channel, and thus may improve the retention abilities of knuckle 306. Openings 308 and 310 can have any suitable shape including, for example, a curved or angled cross-section, or a variable cross-section.

Component 320 shown in FIG. 3B can be constructed by connecting first and second sections 322 and 324 using knuckle 326. To improve the adhesion of knuckle 326 to first section 322 and second section 324, knuckle 326 can include overflowing portions 328 extending beyond the cross-section of first section 322 and second section 324. This may cause overflowing portion 328 to come into contact with exposed outer surfaces of first section 322 and second section 324. Overflowing portions 328 can extend over any suitable surface of first section 322 and second section 324 including, for example, over one or more of a top surface, a bottom surface, a front surface, or a back surface, and/or along only one of the first and second sections, or various combinations of these.

Component 340 shown in FIG. 3C can be constructed by connecting first sections 342 and second section 344 using knuckle 346. First sections 342 and second section 344 can include openings 348 and 330, and channels 349 and 331, respectively, as described above in connection with component 300. To allow openings 348 and 330 to extend through the entire height of first and second sections 342 and 344, while maintaining uniform and consistent external surfaces of the sections, the first and second sections can include chamfers 343 and 345, respectively, extending from a surface of the sections. For example, the chamfers can extend from an internal surface of first and second sections 342 and 344, such that the chamfers extend within an internal volume of an electronic device that includes component 340. Openings 348 and 330 can extend through chamfers 343 and 345, respectively, instead of or in addition to the main bodies of the sections 342 and 344.

Figure 4:
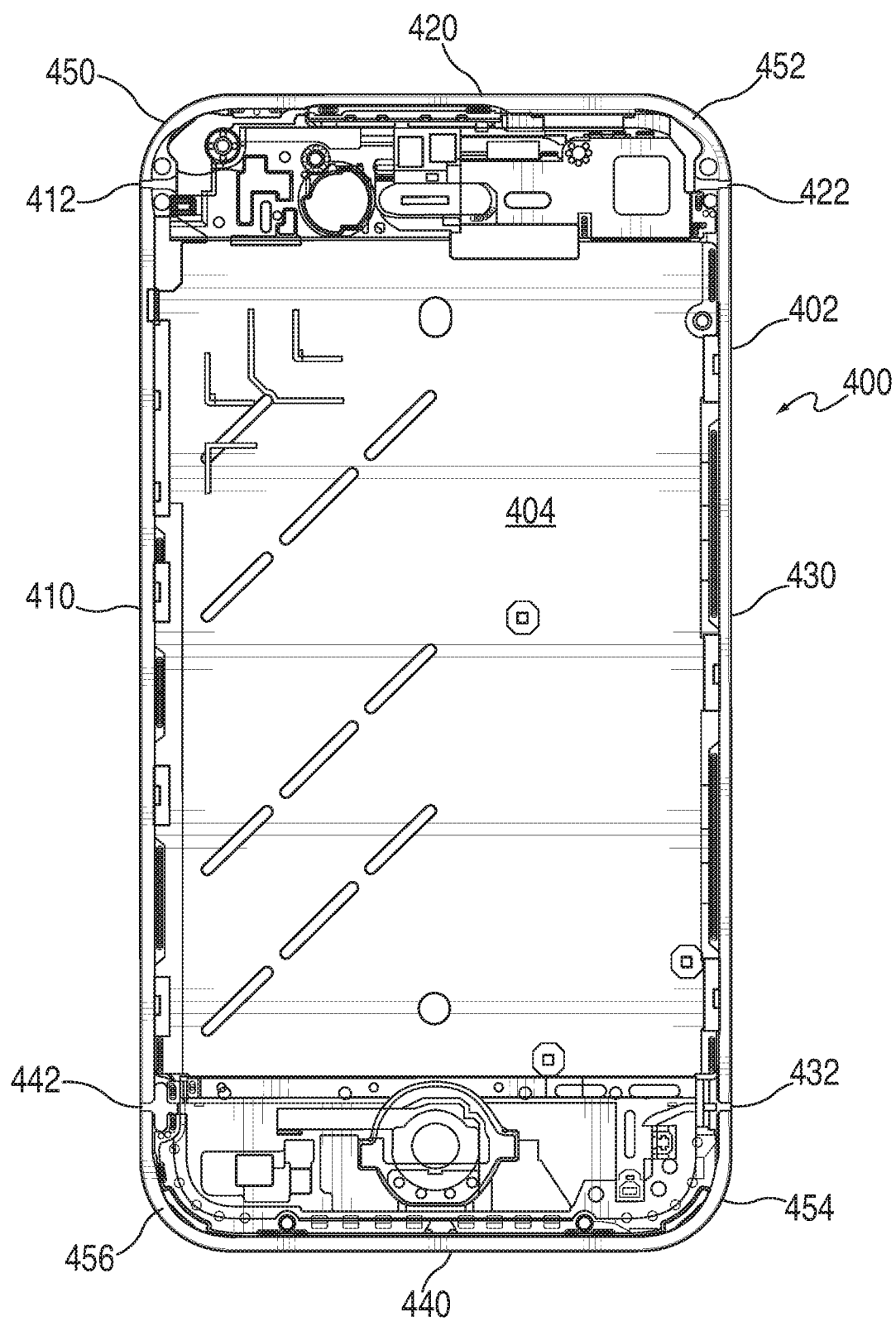
FIG. 4 shows a schematic view of an illustrative outer periphery component with knuckles in accordance with some embodiments of the invention.

FIG. 4 shows an illustrative schematic view of components of electronic device 400 in accordance with some embodiments. For example, FIG. 4 shows an outer periphery component 402 encircling an inner component 404. For example, inner component 404 could include a midplate or other structural support component of electronic device 400. Similar to outer periphery component 100 of FIG. 1, outer periphery component 402 can be assembled together from various sections. In particular, outer periphery component 402 is illustrated as being assembled from four sections— section 410, section 420, section 430, and section 440— however, one skilled in the art could appreciate that any other suitable number or setup of section could be used to form outer periphery component 402. Outer periphery component 402 can also include four rounded corners (i.e., splines 450, 452, 454, and 456). As mentioned above, the term "spline" as used herein refers to a rounded corner portion of an outer periphery component.

In some embodiment, each of sections 410, 420, 430, and 440 can be formed from a conductive material and can function as an antenna or other electric circuit component of electronic device 400. As an illustration, section 410 could function as a Bluetooth® antenna, section 420 could function as a WiFi antenna, and sections 430 and 440 could function as a cellular telephone antenna (e.g., where section 430 could service a particular frequency range and section 440 could service a different frequency range).

Sections 410, 420, 430, and 440 can each be coupled to another section using knuckles 412, 422, 432, and 442 (e.g., where knuckle 412 can couple section 410 and 420 together, knuckle 422 can couple section 420 and 430 together, and so forth). In order to electrically isolate the sections of outer periphery component 402 (e.g., in the case where each section functions as an antenna or other electric circuit component), in some cases knuckles 412, 422, 432, and/or 442 can be formed from a dielectric or other isolating material.

In some cases, one or all of the knuckles can be included within the splines of outer periphery component 402. For example, knuckles 412 and 422 are illustrated in FIG. 4 as being positioned with the curves of splines 450 and 452, respectively. Similarly, although knuckles 432 and 442 are not illustrated as being located directly within the curve of a spline, these knuckles are illustrated as being positioned significantly within the vicinity of splines 454 and 456, respectively. Although FIG. 4 illustrates a particular number of knuckles located in a particular position, one skilled in the art could appreciate that outer periphery component 402 could alternatively include any suitable number of knuckles, and any suitable number of these knuckles could be located within a spline and/or adjacent to a spline or within any other suitable location of outer periphery component 402. In particular, the sections and placement of knuckles within electronic device 400 can be determined based on the layout of internal components and/or other structural design considerations of electronic device 400.

The particular shape and structure of a knuckle can be based upon various design considerations. For example, as mentioned above, in some cases the knuckle can provide for electrical isolation between sections of the outer periphery component. Thus, the knuckle can be designed in order to meet certain, minimum capacitance requirements (e.g., where a greater amount of capacitance can result in greater electrical isolation between the component's sections). As a particular illustration, the knuckle can be designed to have an increased amount of surface area, thus increasing the capacitance between the adjacent sections.

As another exemplary design consideration, the knuckles can be designed in order to have an increased amount of material in areas of high strain, thus reducing the chances of the knuckle breaking under stress. As yet another exemplary design consideration, the knuckle can be designed to counteract torsional twisting. For example, ribs can be included in the knuckles to increase the stability of the structure, thereby reducing the chances of torsional movement and breaking of the outer periphery component. Such ribs or other support may especially be beneficial when the knuckles are located within a spline area of the outer periphery component. For example, if an electronic device is accidentally dropped, the spline area may be especially vulnerable to breakage due to the concentrated impact forces upon the corners of the electronic device (e.g., in this case knuckles 412 and 422 of FIG. 4 may be more vulnerable than knuckles 422 and 432 of FIG. 4). Thus, knuckles can be designed in a manner that counteracts such impact forces (e.g., by adding ribs and/or providing a thickened middle portion).

As yet another exemplary design consideration, the knuckles can be designed in a manner that is aesthetically pleasing or that otherwise meets cosmetic requirements. For example, the knuckle can be designed in a manner which hides some or all of the knuckle under the outer periphery component, such that a user may only view the polished, outer surface of the electronic device. As another example, the knuckle can be designed such that it is flush with an outer surface of the outer periphery component, such that the electronic device has a smooth surface free of bumps or protrusions.

Figure 5A:
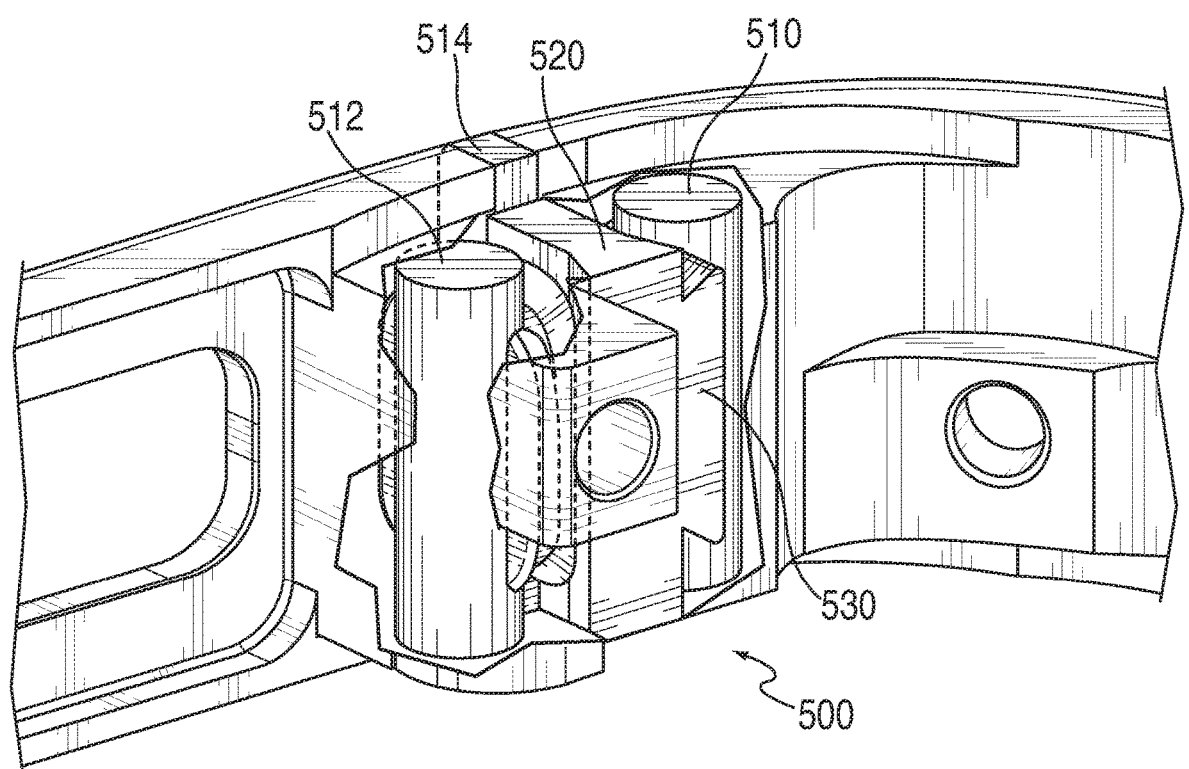
FIGS. 5A-5E show various schematic views of a particular knuckle design in accordance with one embodiment of the invention.
Figure 5B:
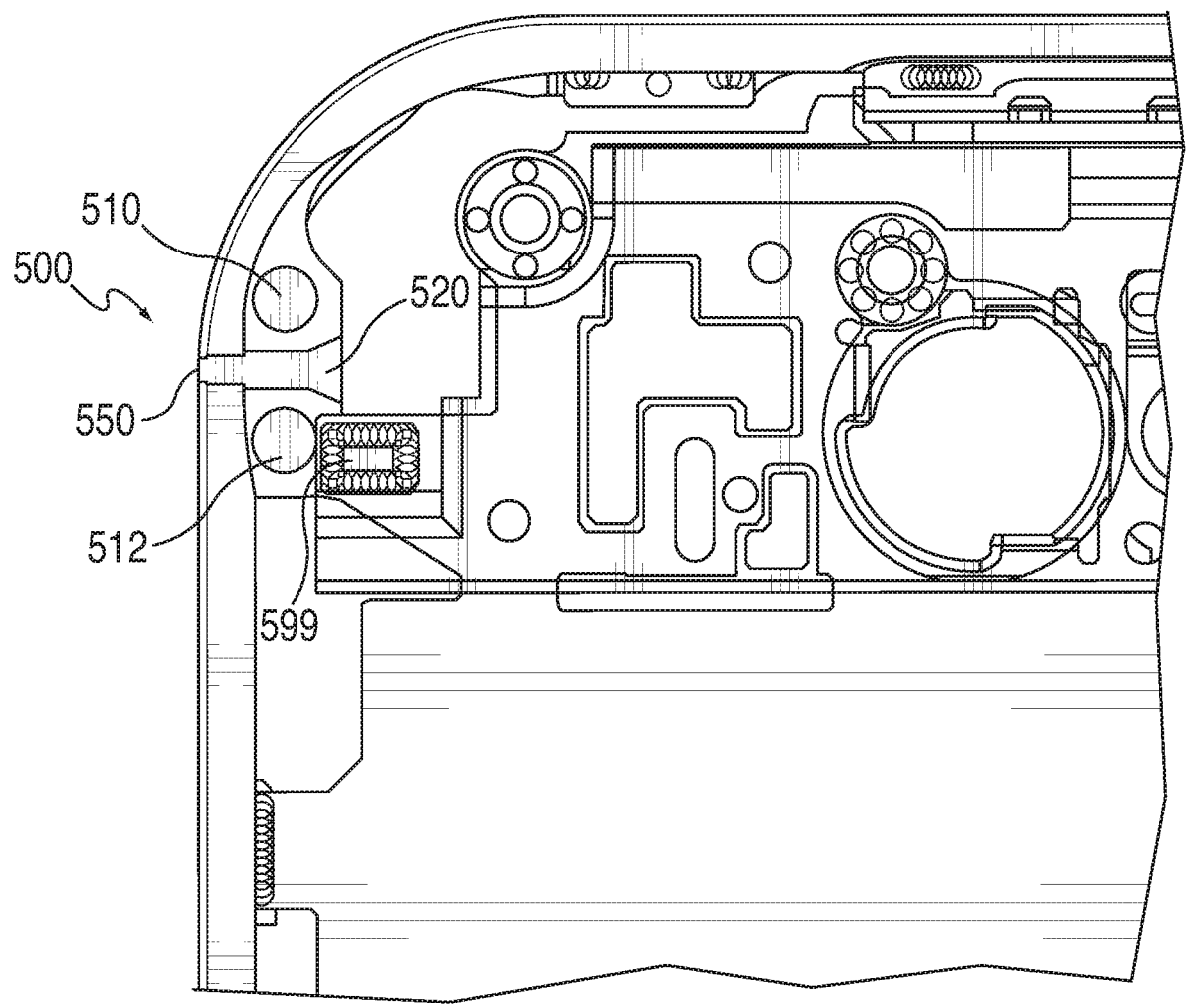
Figure 5C:
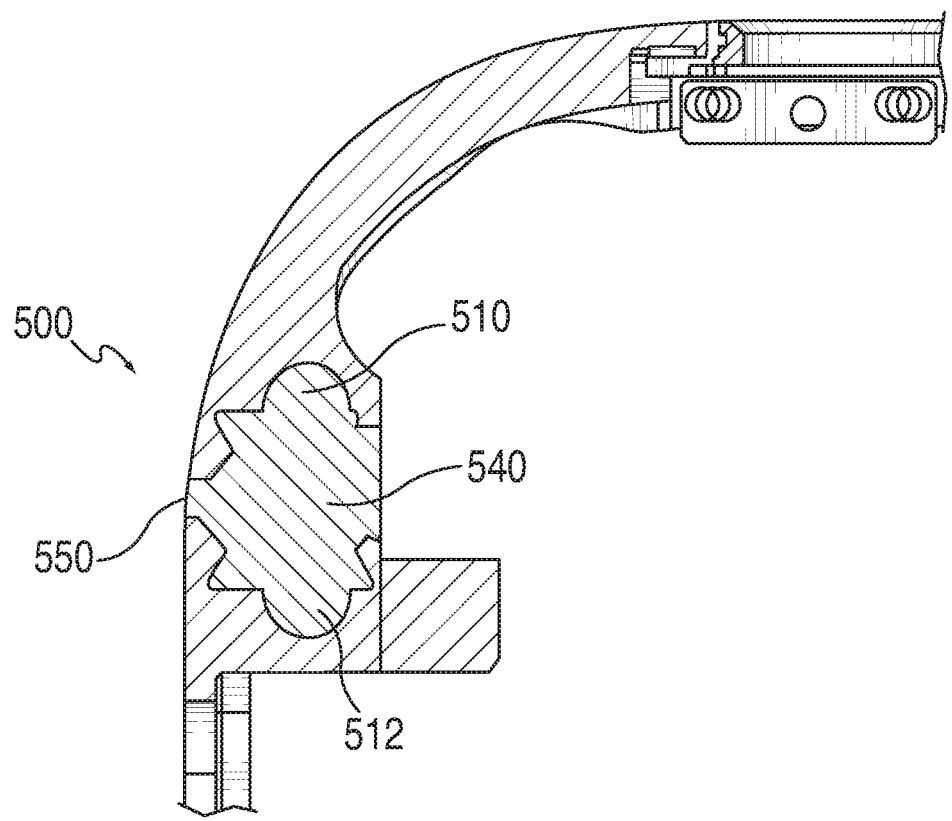
Figure 5D:
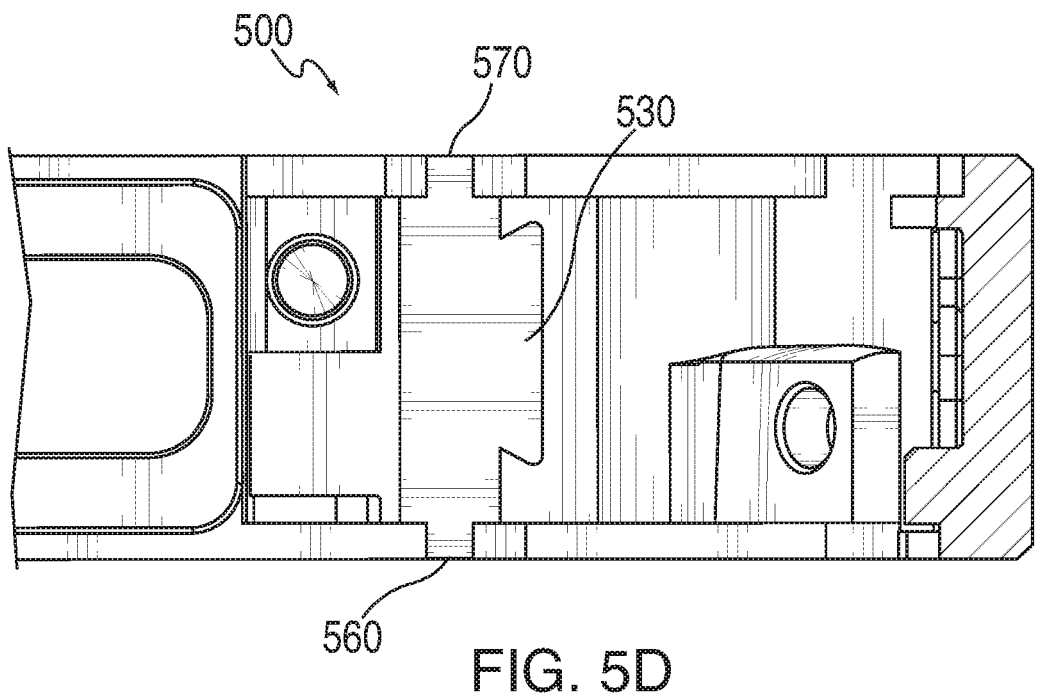
Figure 5E:
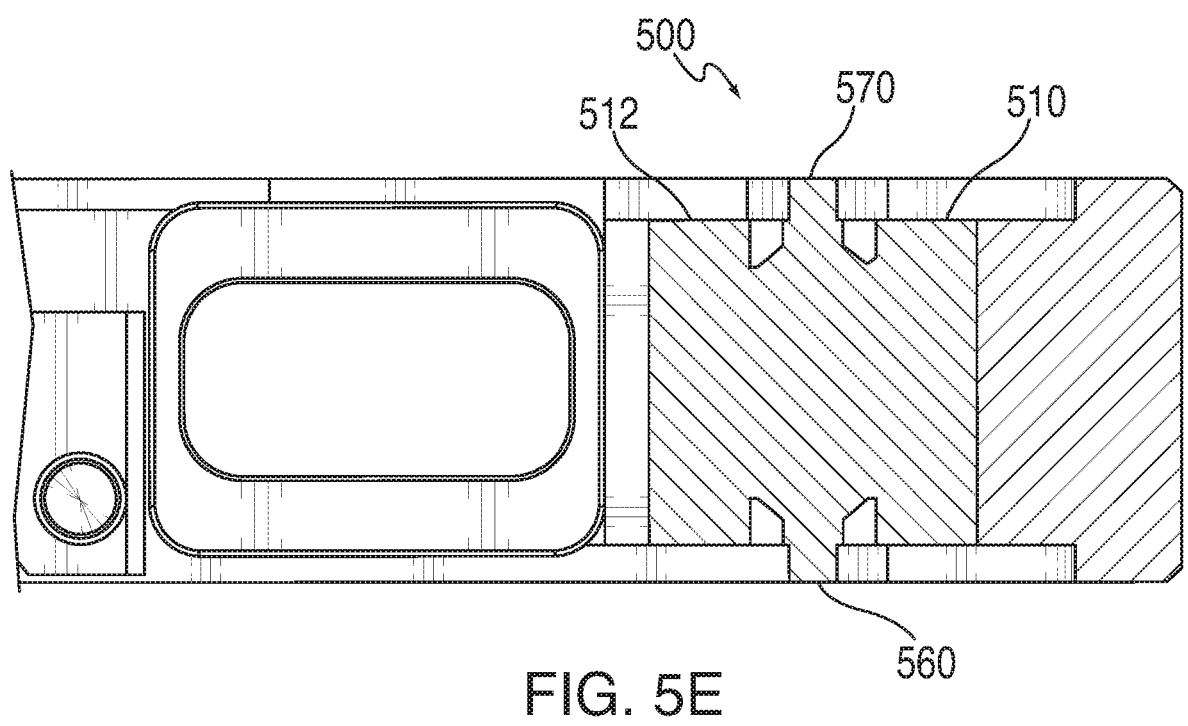

FIGS. 5A-5E show various views of a schematic of a particular design for knuckle 500 in accordance with one embodiment. For example, knuckle 500 could correspond to a particular embodiment of one or more of the knuckles of electronic device 400 of FIG. 4. In particular, FIG. 5A shows an isotropic view of knuckle 500, FIG. 5B shows a top view of knuckle 500, FIG. 5C shows a cross-sectional view of knuckle 500 along an x-y plane, FIG. 5D shows a side view of knuckle 500 from the inside of an electronic device, and FIG. 5E shows a cross-sectional view of knuckle 500 along a y-z plane.

As shown in FIGS. 5A-5E, knuckle 500 can include various rib features, such as rib 510 and rib 512. Rib 510 may lock into a first section of the outer periphery component and rib 512 may lock into a second section of the outer periphery component, thereby coupling the first section and the second section together. Rib 510 and 512 can be any suitable shape, such as cylindrical shape which extends substantially through the height of the outer periphery component. Ribs 510 and 512 can have a diameter which is sufficiently large to provide a secure bonding with the sections, thereby providing stability and resisting torsional movement of the sections. Knuckle 500 can also include spine 514 extending along the height of the knuckle, thereby providing strength and stability for knuckle 500.

As shown in FIGS. 5A-5E, knuckle 500 can also include various "dovetail" features, such as dovetail 520 placed horizontally with regards to knuckle 500 (e.g., located in the x-y plane) and dovetail 530 placed vertically with regards to knuckle 500 (e.g., located in the z-y plane). Dovetails 520 and 530 may provide additional stability and support for knuckle 500, and moreover can increase the thickness of knuckle 500 (e.g., thereby providing increased electrical isolation between the sections and/or increasing the mechanical stability of knuckle 500).

In some embodiments, knuckle 500 can be designed and positioned in a particular manner based on other components within the electronic device. For example, FIG. 5B illustrates internal component 599 located near knuckle 500. Due to internal design constraints, it may not be possible to move internal component 599 to a different position within the electronic device. Accordingly, knuckle 500 may instead be designed in a manner such that it does not encroach upon or otherwise adversely affect internal component 599. As another illustration, knuckle 500 can be designed in a manner such that it provides structural support for internal component 599. For example, internal component 599 is illustrated in FIG. 5B as resting against knuckle 500.

Knuckle 500 can also be designed such that is has a significantly large middle area, thus providing enhanced structural support for knuckle 500. For example, the x-y cross-sectional view of FIG. 5C shows middle portion 540 of knuckle 500. As illustrated by this viewpoint, knuckle 500 has a relatively large cross-sectional middle portion 540.

Additionally, knuckle 500 can also be designed such that the resulting electronic device is aesthetically pleasing. For example, any exposed outer surface of knuckle 500 can be designed such that they are flush with an outer surface of the electronic device, such as surface 550 (FIGS. 5B and 5C), surface 560 (FIGS. 5D and 5E), and surface 570 (FIGS. 5D and 5E).

Figure 6A:
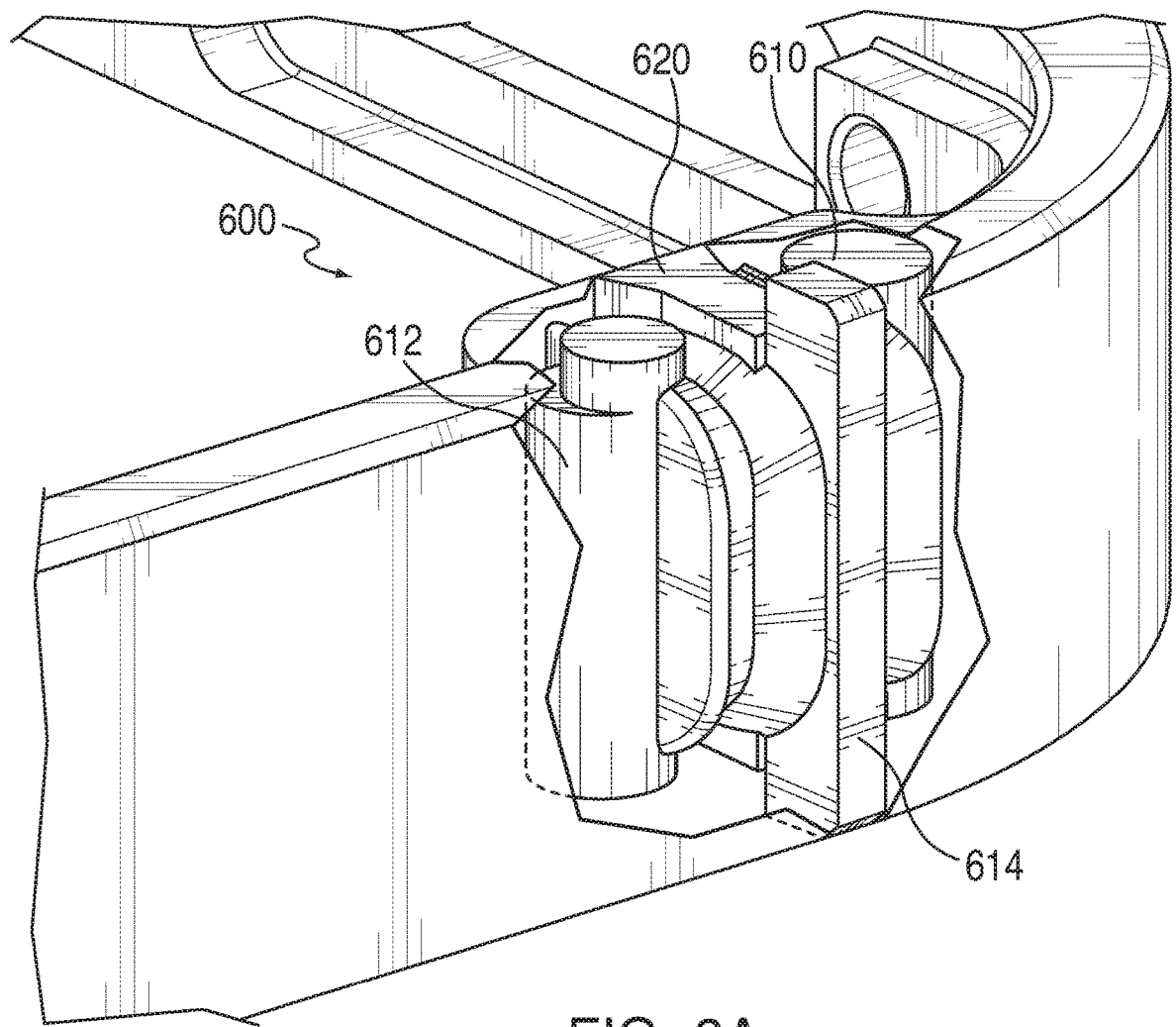
FIGS. 6A-6E show various schematic views of another particular knuckle design in accordance with one embodiment of the invention.
Figure 6B:
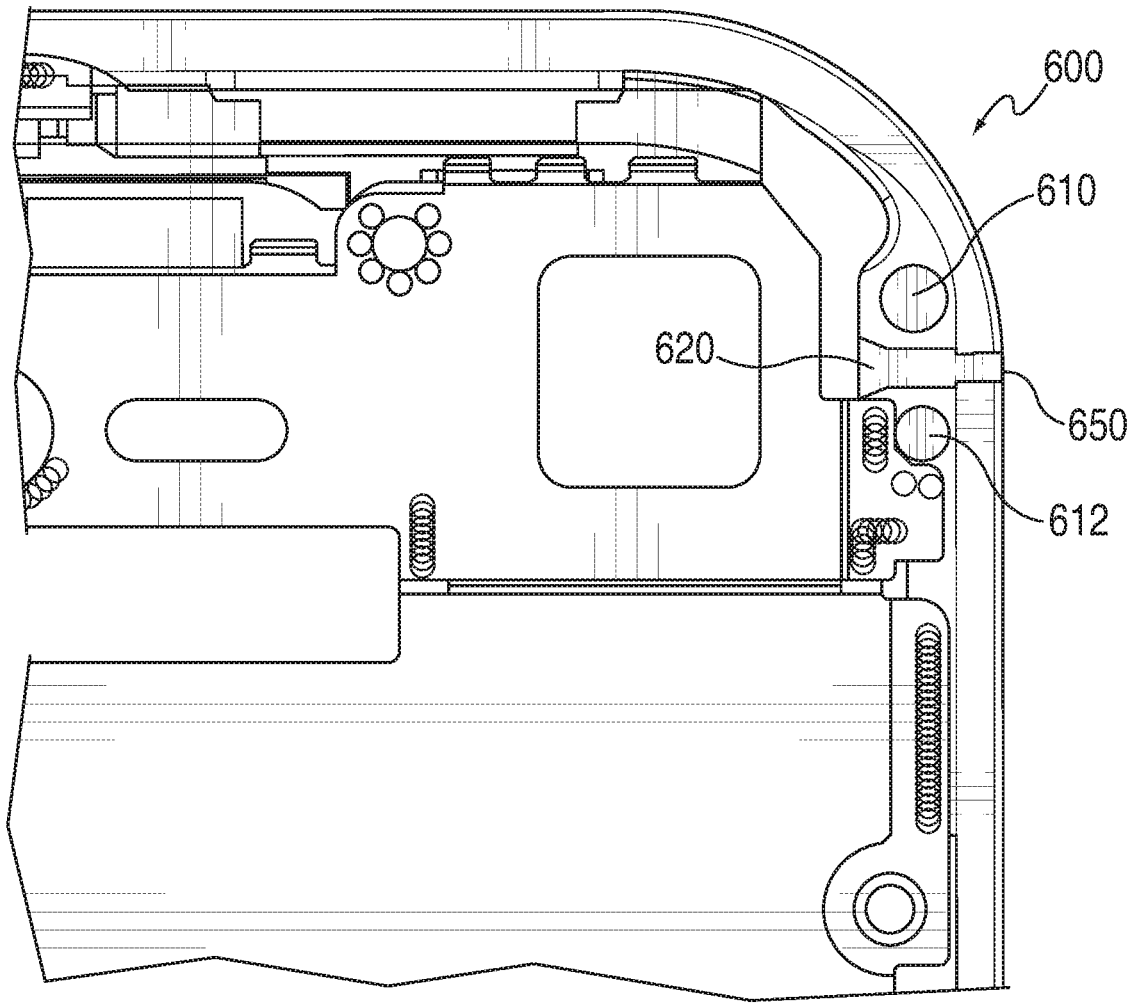
Figure 6C:
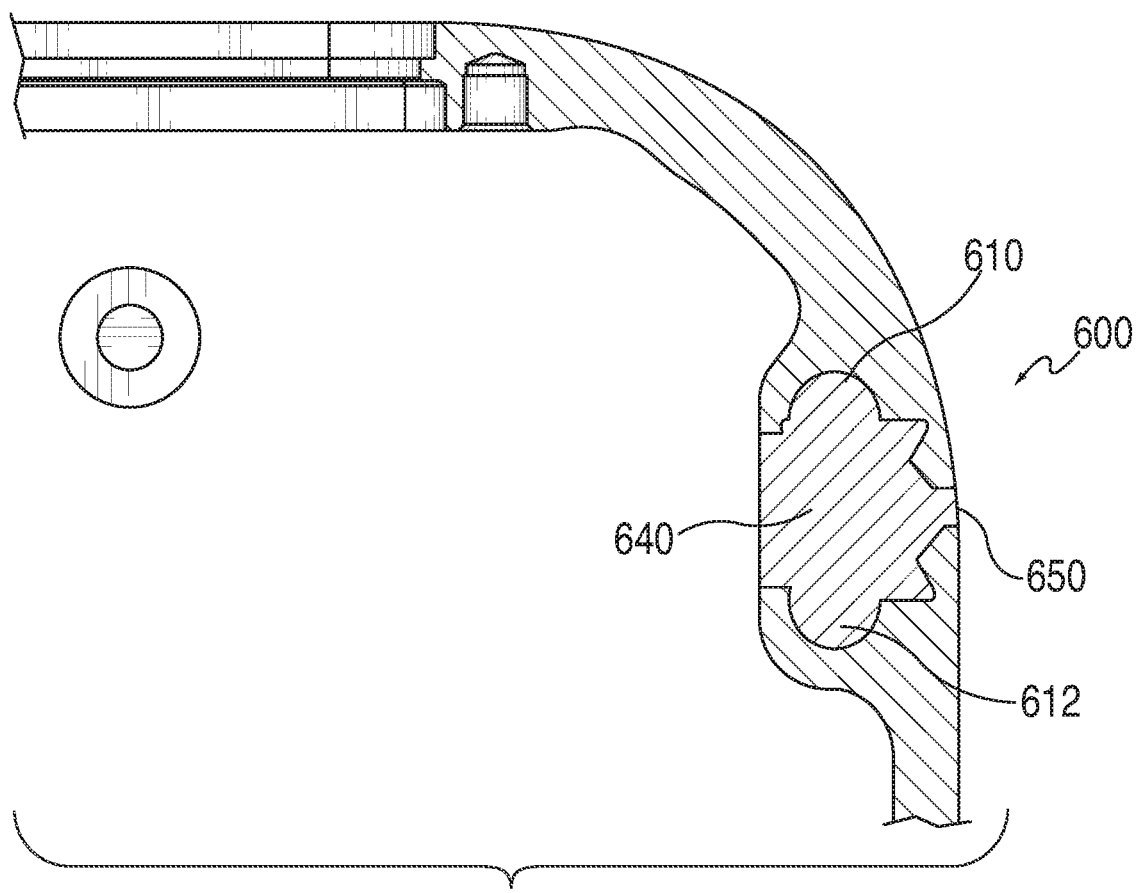
Figure 6D:
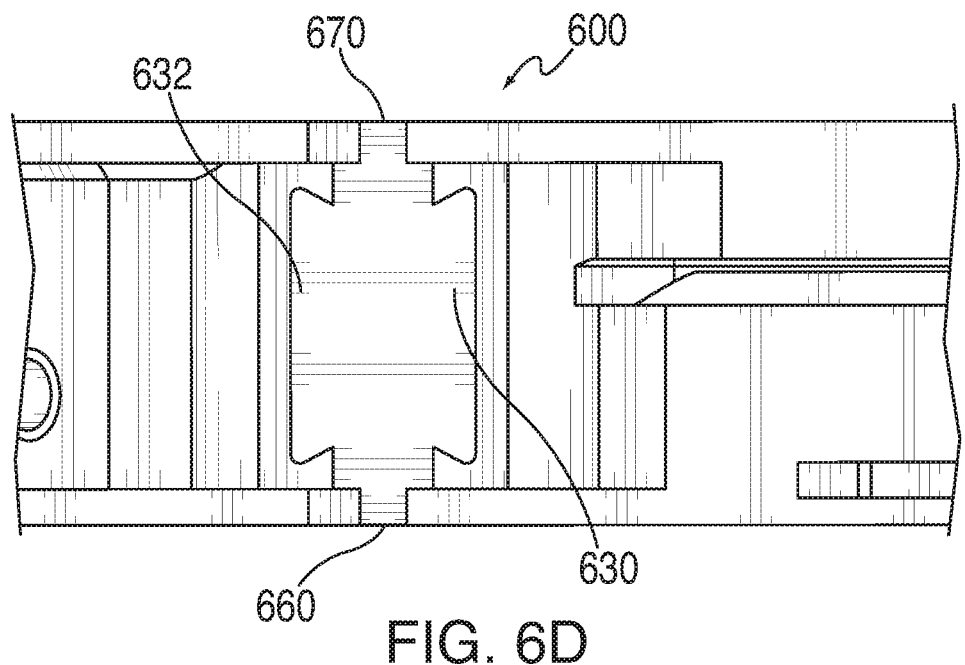
Figure 6E:
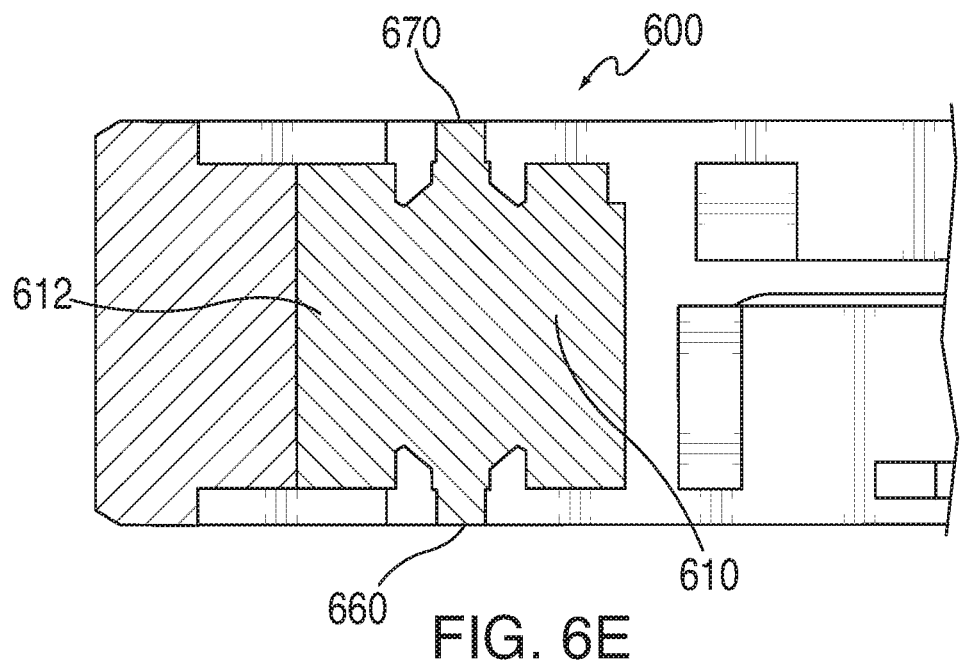

FIGS. 6A-6E show various views of a schematic of another exemplary design for a knuckle in accordance with one embodiment. For example, knuckle 600 could correspond to a particular embodiment of one or more of the knuckles of electronic device 400 of FIG. 4. In particular, FIG. 6A shows an isotropic view of knuckle 600, FIG. 6B shows a top view of knuckle 600, FIG. 6C shows a cross-sectional view of knuckle 600 along an x-y plane, FIG. 6D shows a side view of knuckle 600 from inside an electronic device, and FIG. 6E shows a cross-sectional view of knuckle 600 along a y-z plane.

Similar to knuckle 500 of FIGS. 5A-5E, knuckle 600 can include rib 610, rib 612, spine 614, dovetail 620, and middle portion 640. Also similar to knuckle 500 of FIGS. 5A-5E, knuckle 600 can include surfaces 650, 660, and 670 that can be substantially flush with a surface of the electronic device, thereby providing an aesthetically pleasing facade for the electronic device. However, dissimilar to knuckle 500 of FIGS. 5A-5E, knuckle 600 may include two instance of a vertical dovetail, such as dovetails 630 and 632 (FIG. 6D). As described above with regards to FIGS. 5A-5E, knuckle 500 may be designed in a particular manner based on inner components of the electronic device, such as inner component 599. In other words, knuckle 500 may have only a single dovetail 530 in order to avoid encroaching onto inner component 599. However, knuckle 600 of FIGS. 6A-6E may instead by located in a portion of the electronic device that is not adjacent to any inner components. Accordingly, knuckle 600 can have two vertical dovetails, dovetails 630 and 632. The additional vertical dovetail can thus increase the mechanical stability of knuckle 600 by providing symmetric stability around the knuckle's axis. Additionally, each of dovetails 630 and 632 may lock into a different section of an outer periphery component; thus, the two instance of dovetail 630 and 632 can help ensure that each of these sections are securely coupled to knuckle 600.

Figure 7A:
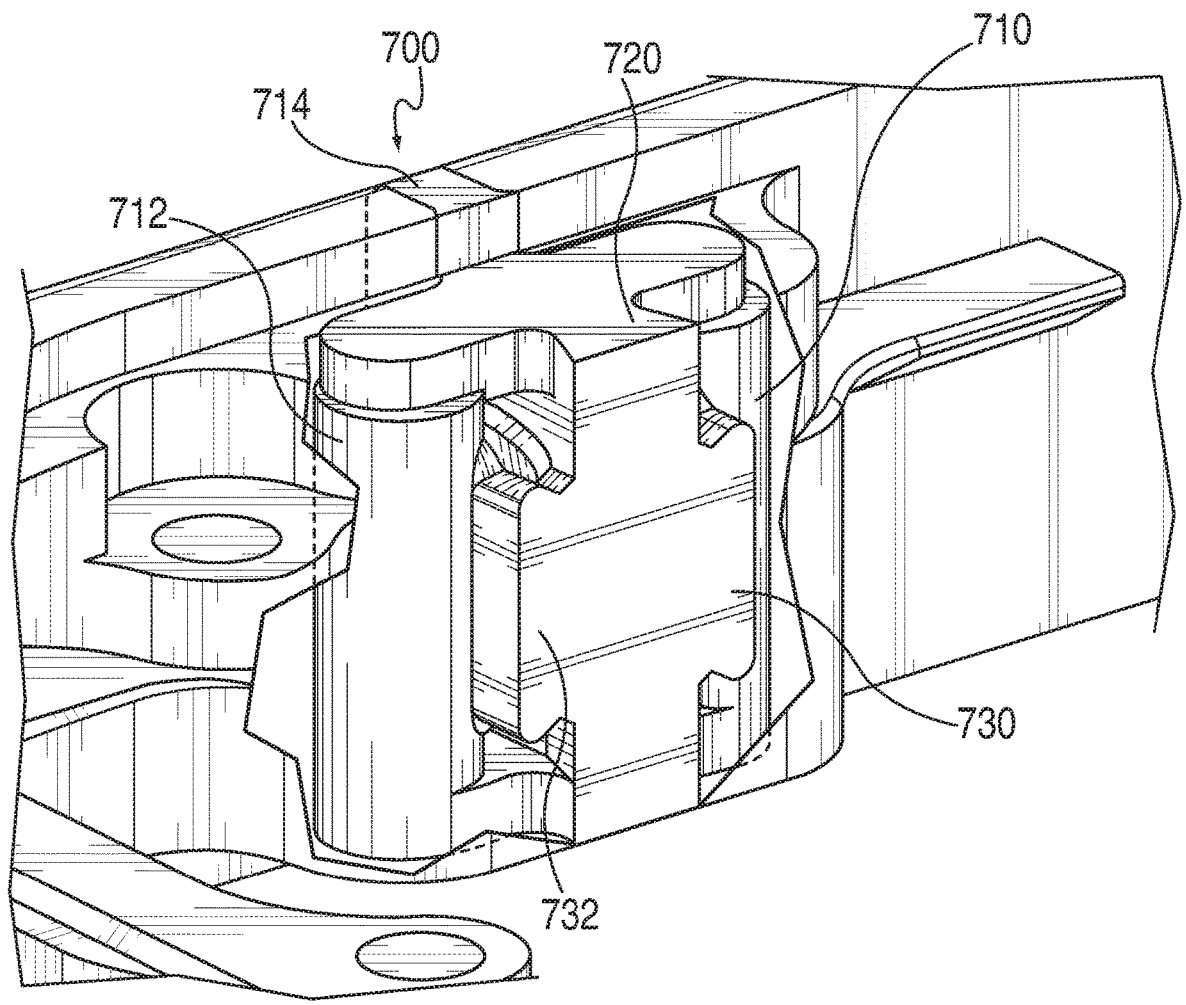
FIGS. 7A-7E show various schematic views of another particular knuckle design in accordance with one embodiment of the invention.
Figure 7B:
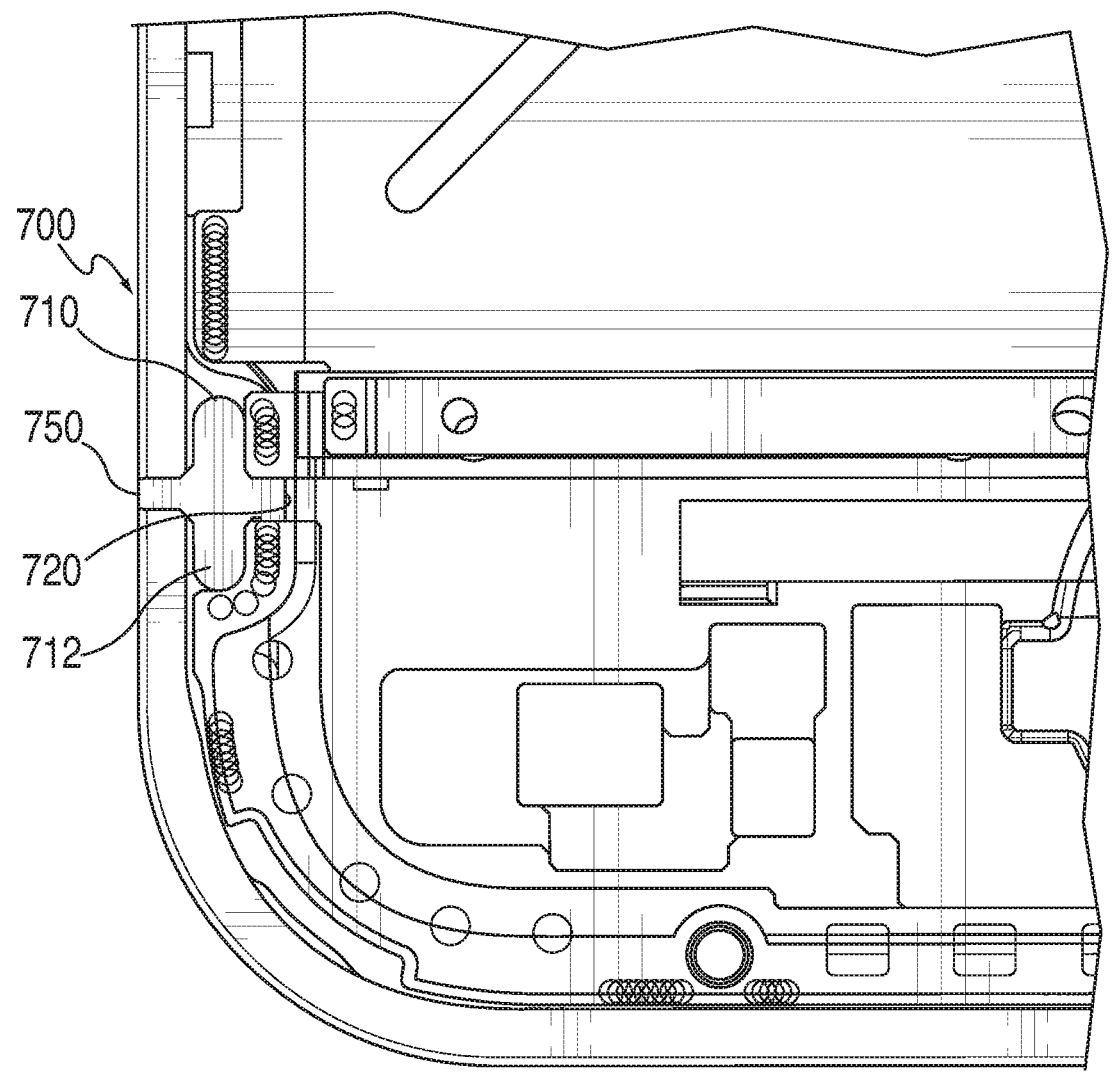
Figure 7C:
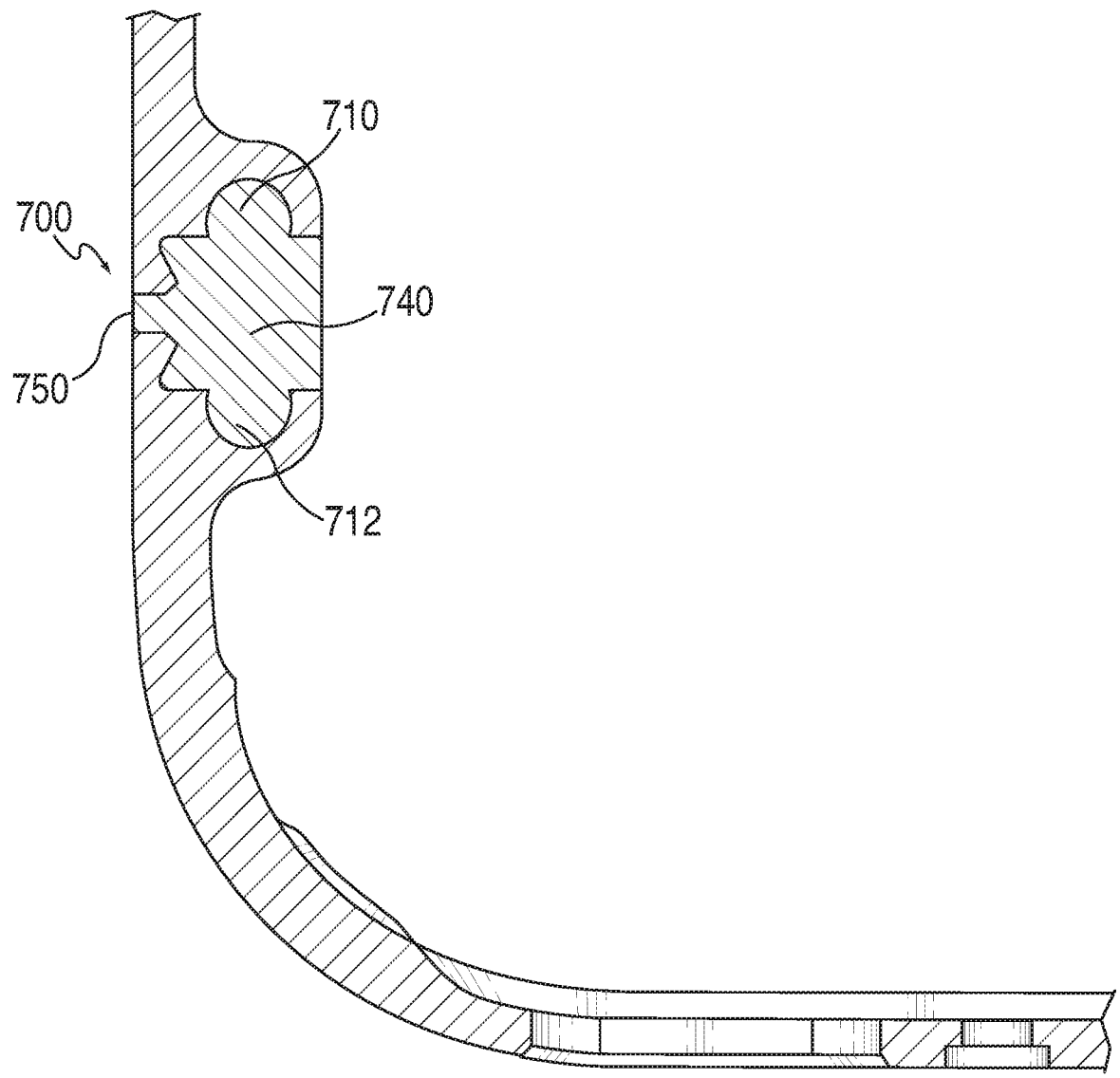
Figure 7D:
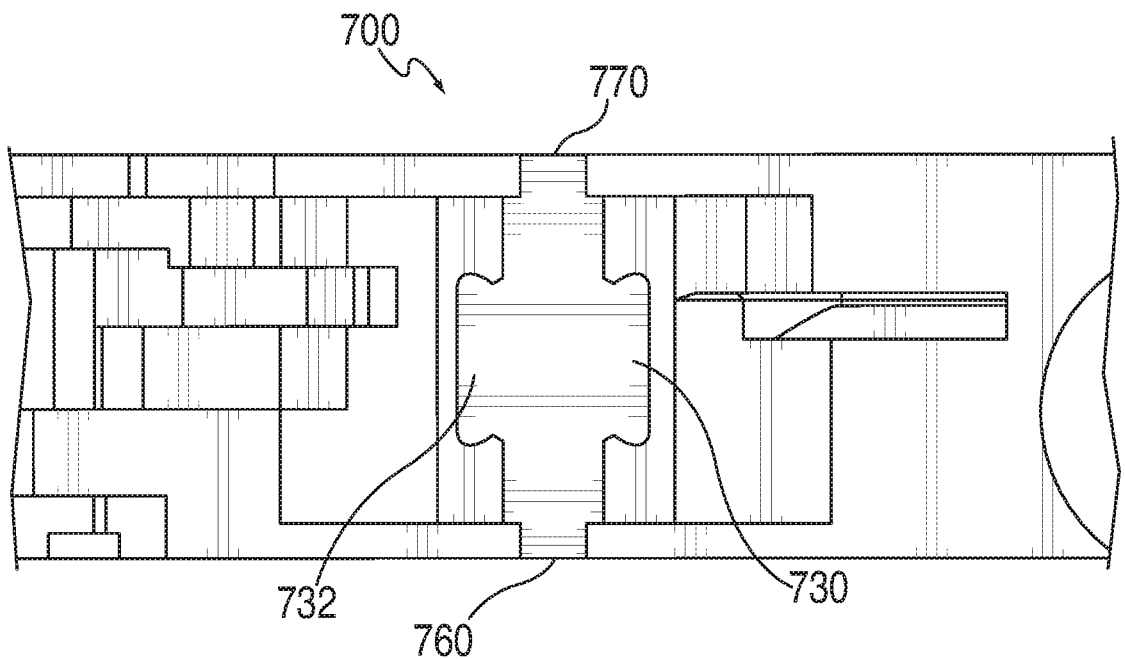
Figure 7E:
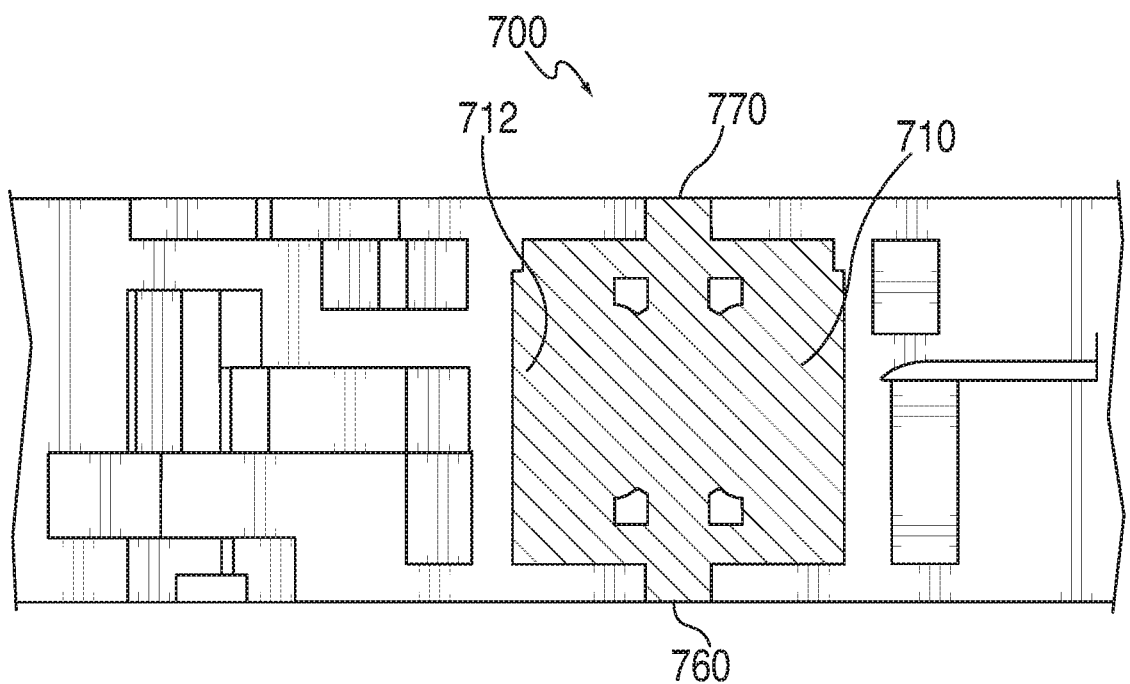

FIGS. 7A-7E show various views of a schematic of another exemplary design for a knuckle in accordance with one embodiment. For example, knuckle 700 could correspond to a particular embodiment of one or more of the knuckles of electronic device 400 of FIG. 4. In particular, FIG. 7A shows an isotropic view of knuckle 700, FIG. 7B shows a top view of knuckle 700, FIG. 7C shows a cross-sectional view of knuckle 700 along an x-y plane, FIG. 7D shows a side view of knuckle 700 from inside an electronic device, and FIG. 7E shows a cross-sectional view of knuckle 700 along a y-z plane.

Similar to knuckle 600 of FIGS. 6A-6E, knuckle 700 can include rib 710, rib 712, spine 714, dovetail 720, dovetail 730, dovetail 732, and middle portion 740. Also similar to knuckle 600 of FIGS. 6A-6E, knuckle 700 can include surfaces 750, 760, and 770 that can be substantially flush with a surface of the electronic device, thereby providing an aesthetically pleasing facade for the electronic device. However, dissimilar to knuckle 600, the corners of dovetails 730 and 732 (FIG. 7D) can be relatively more rounded than dovetails 630 and 632 (FIG. 6D), respectively. Also dissimilar to knuckle 600, ribs 710 and 712 can be relatively enlarged, such that ribs 710 and 712 substantially form an oval shape together. For example, when viewing the cross-sectional view of knuckle 700 in the y-z plane (FIG. 7E), ribs 710 and 712 can together extend substantially across the entire top length of knuckle 700. Such a design may significantly increase the surface area of knuckle 700. This, in turn, can increase the capacitance of knuckle 700, thus providing increased electrical isolation between sections coupled by knuckle 700.

In some embodiments, the electronic device can undergo impact testing to ensure the knuckle has been designed with sufficient structural stability and strength. For example, in some cases a "Mean Drops to Failure" test can be used. In a Mean Drops to Failure test, an electronic device can be repeatedly dropped from a same height. For example, the electronic device can be repeatedly dropped from a height of 1.2 meters. Several electronic devices can be repeatedly dropped until they finally fail (e.g., break). The mean number of drops required to fail the electronic device can then be determined, and compared to threshold value. As an illustration, in order to pass the test, the electronic devices must meet a threshold value of greater than 30 means drops to failure, or any other suitable threshold value. In some embodiments, the electronic device can be dropped while at 100% of its weight (e.g., rather than adding weights to the electronic device, or removing weight from the electronic device). Such testing methods may give more accurate results than, for example, merely dropping an electronic device a fixed number of times.

It should be understood that the processes described above are merely illustrative. Any of the steps may be removed, modified, or combined, and any additional steps may be added or steps may be performed in different orders, without departing from the scope of the invention.

The described embodiments of the invention are presented for the purpose of illustration and not of limitation.

What is claimed is:

1. An electronic device comprising:
electronic components; and
a housing enclosing the electronic components and defining an exterior surface of the electronic device, the housing comprising:
a first conductive member defining a first corner of the housing and a first portion of the exterior surface;
a second conductive member defining a second portion of the exterior surface;
a first insulating member positioned between the first conductive member and the second conductive member and defining a third portion of the exterior surface;
a third conductive member defining a second corner of the housing and a fourth portion of the exterior surface; and
a second insulating member positioned between the second conductive member and the third conductive member and defining a fifth portion of the exterior surface.

2. The electronic device of claim 1, wherein:
the electronic components include a circuit; and
the first conductive member is electrically coupled to the circuit and defines at least a portion of an antenna.

3. The electronic device of claim 1, wherein:
the first insulating member electrically isolates the first conductive member from the second conductive member; and
the first insulating member structurally couples the first conductive member to the second conductive member.

4. The electronic device of claim 1, wherein:
the first conductive member comprises a first coupling feature positioned within the first corner of the housing;
the second conductive member comprises a second coupling feature; and
the first insulating member mechanically engages the first coupling feature and the second coupling feature.

5. The electronic device of claim 4, wherein:
the first coupling feature defines a first opening;
the second coupling feature defines a second opening; and
the first insulating member at least partially fills the first opening and the second opening.

6. The electronic device of claim 4, wherein:
the first insulating member is injected molded between the first conductive member and the second conductive member to mechanically engage the first coupling feature and the second coupling feature.

7. The electronic device of claim 1, wherein the first conductive member, the first insulating member, the second conductive member, the second insulating member and the third conductive member collectively define a first continuous surface of a first side of the housing.

8. The electronic device of claim 1, wherein:
the first conductive member defines a third corner that is opposite to the first corner; and
the third conductive member defines a fourth corner that is opposite to the second corner.

9. The electronic device of claim 8, wherein:
the second conductive member defines at least a portion of a first side of the housing; and
the housing further comprises a fourth conductive member that defines at least a second side of the housing that is opposite to the first side.

10. The electronic device of claim 9, wherein the housing further comprises:
a third insulating member positioned between the first conductive member and the fourth conductive member; and
a fourth insulating member positioned between the third conductive member and the fourth conductive member.

11. A housing of an electronic device comprising:
a first conductive section defining a first exterior sidewall and a first corner of the housing;
a second conductive section defining a second exterior sidewall of the housing;
a first insulating element positioned at least partially between the first conductive section and the second conductive section, and defining a third exterior sidewall of the housing;
a third conductive section defining a fourth exterior sidewall and a second corner of the housing; and
a second insulating element positioned at least partially between the second conductive section and the third conductive section, and defining a fifth exterior sidewall of the housing.

12. The housing of claim 11, wherein:
the first insulating element electrically isolates the first conductive section from the second conductive section; and
the first insulating element structurally couples the first conductive section to the second conductive section.

13. The housing of claim 12, wherein the first conductive section is configured to operate as an antenna for the electronic device.

14. The housing of claim 11, wherein the first conductive section further defines a third corner of the housing opposite the first corner.

15. The housing of claim 11, wherein:
the first conductive section defines a first coupling feature;
the second conductive section defines a second coupling feature; and
the first insulating element is molded between the first and second conductive sections to mechanically engage the first and second coupling features.

16. An electronic device comprising:
electronic components;
a housing at least partially surrounding the electronic components, the housing comprising:
a first conductive segment defining a first corner of the housing, at least a portion of a top surface of the housing, and a first coupling feature positioned along an inner portion of the first corner;
a second conductive segment defining at least a portion of a side surface of the housing, and a second coupling feature; and
an insulating segment positioned at least partially between the first conductive segment and the second conductive segment, the insulating segment mechanically coupled to the first and second coupling features and defining a portion of an outer surface of the housing.

17. The electronic device of claim 16, wherein:
the housing further comprises a third conductive segment defining a second corner and at least a portion of a bottom surface of the housing;
the insulating segment is a first insulating segment; and the housing further comprises a second insulating segment positioned at least partially between the second conductive segment and the third conductive segment.

18. The electronic device of claim 17, wherein:
the first conductive segment defines a third corner of the housing; and
the third conductive segment defines a fourth corner of the housing.

19. The electronic device of claim 17, wherein:
the first insulating segment is formed from a plastic material that is injected molded between the first and second conductive segments to mechanically couple the first insulating segment to the first and second coupling features.

20. The electronic device of claim 16, wherein:
the electronic components include a circuit; and
the first conductive segment is electrically coupled to the circuit and forms an antenna of the electronic device.

21. The electronic device of claim 16, wherein:
the insulating segment is formed from a plastic material; and
the first conductive segment and the second conductive segment are formed from a same metal material.

* * * * *